United States Patent
St. Clair et al.

(10) Patent No.: US 12,293,452 B2
(45) Date of Patent: May 6, 2025

(54) ROOM SHADERS FOR ANIMATED MOVIES

(71) Applicants: Sony Corporation, Tokyo (JP); Sony Pictures Entertainment Inc., Culver City, CA (US)

(72) Inventors: Bret St. Clair, Culver City, CA (US); Ole Gulbrandsen, Culver City, CA (US)

(73) Assignees: SONY GROUP CORPORATION, Tokyo (JP); SONY PICTURES ENTERTAINMENT INC., Culver City, CA (US)

( * ) Notice: Subject to any disclaimer, the term of this patent is extended or adjusted under 35 U.S.C. 154(b) by 0 days.

(21) Appl. No.: 16/705,037

(22) Filed: Dec. 5, 2019

(65) Prior Publication Data

US 2020/0184716 A1   Jun. 11, 2020

Related U.S. Application Data

(60) Provisional application No. 62/776,336, filed on Dec. 6, 2018, provisional application No. 62/775,830, filed on Dec. 5, 2018.

(51) Int. Cl.
*G06T 15/87* (2011.01)
*G06F 30/13* (2020.01)
(Continued)

(52) U.S. Cl.
CPC .............. *G06T 15/87* (2013.01); *G06F 30/13* (2020.01); *G06T 13/80* (2013.01); *G06T 15/005* (2013.01);
(Continued)

(58) Field of Classification Search
CPC ................................ G06T 15/50; G06T 15/87
See application file for complete search history.

(56) References Cited

U.S. PATENT DOCUMENTS

| | | |
|---|---|---|
| 2012/0249539 A1 | 10/2012 | Bhattacharya et al. |
| 2015/0213632 A1 | 7/2015 | Trask |

(Continued)

FOREIGN PATENT DOCUMENTS

| | | |
|---|---|---|
| CN | 106127848 A | 11/2016 |
| CN | 106255996 A | 12/2016 |

(Continued)

OTHER PUBLICATIONS

Van Dongen, J. Interior Mapping, CGI 2008 Conference Proceedings [retrieved on Jan. 19, 2020] Retrieved from the internet: <http://www.proun-game.com/Oogst3D/CODING/InteriorMapping/InteriorMapping.pdf>.

(Continued)

*Primary Examiner* — Matthew Salvucci
(74) *Attorney, Agent, or Firm* — Procopio, Cory, Hargreaves & Savitch LLP

(57) ABSTRACT

Generating image data for a room image, including: generating at least one planar layer in depth for a first room image; generating at least one wall layer for a wall in the first room image; creating a second room image by duplicating one or more of the at least one planar layer for the first room image and duplicating one of more of the at least one wall layer for the first room image, and modifying the at least one duplicate planar layer and the at least one duplicate wall layer; and applying the first room image and the second room image as patterns to a surface of a building image.

13 Claims, 4 Drawing Sheets

(51) Int. Cl.
*G06T 13/80* (2011.01)
*G06T 15/00* (2011.01)
*G06T 15/50* (2011.01)
*G06T 19/20* (2011.01)

(52) U.S. Cl.
CPC ............ *G06T 15/506* (2013.01); *G06T 19/20* (2013.01); *G06T 2210/04* (2013.01); *G06T 2210/62* (2013.01); *G06T 2219/2012* (2013.01)

(56) References Cited

U.S. PATENT DOCUMENTS

| | | |
|---|---|---|
| 2015/0227644 A1 | 8/2015 | Schultz |
| 2017/0223312 A1 | 8/2017 | McNelley |
| 2017/0372512 A1 | 12/2017 | Yang et al. |
| 2018/0176506 A1* | 6/2018 | McNelley .............. H04N 7/147 |

FOREIGN PATENT DOCUMENTS

| | | |
|---|---|---|
| DE | 4401813 A1 | 7/1995 |
| GB | 0915587 | 10/2009 |
| JP | 2005122564 A | 5/2005 |
| WO | WO-2016106365 A1 | 6/2016 |

OTHER PUBLICATIONS

Chandler et al., "Procedural Window Lighting Effects for Real-Time City Rendering", Proceeding 3D '15 Proceedings of the 19th Symposium on Interactive 3D Graphics and Games; 7 pages.

* cited by examiner

ROOM SHADERS FOR ANIMATED MOVIES

CROSS-REFERENCE TO RELATED APPLICATIONS

This application claims the benefits of priority under 35 U.S.C. § 119(e) of co-pending U.S. Provisional Patent Application No. 62/775,830, filed Dec. 5, 2018, entitled "Magic Cube Shader for Room Interiors/Illustrated Graphic Reflections," and co-pending U.S. Provisional Patent Application No. 62/776,336, filed Dec. 6, 2018, entitled "Quantization of Surface Normals." The disclosures of the above-referenced applications are incorporated herein by reference.

BACKGROUND

Field

The present disclosure relates to animated movies, and more specifically, to room shaders for the animated movies.

Background

In computer graphics, shading is the rendering of photo-realistic or stylized surfaces on a mathematically-defined object. Software written specifically for this purpose, called a shader, is executed by a computer to compute the color and brightness of each pixel in the final image.

In the past, shaders were written to emulate the look of room interiors in buildings to create the illusion of a room in place of real geometry that would be too cumbersome to render due to memory limitations. Thus, the object was to match the look of a real building interior or surface reflection that is seen in real life. However, in some cases, creating an abstract look to match comic book and film specific artwork may be desirable.

SUMMARY

The present disclosure provides for generating image data for a room image.

In one implementation, a method of generating image data for a room image is disclosed. The method includes: generating at least one planar layer in depth for a first room image; generating at least one wall layer for a wall in the first room image; creating a second room image by duplicating one or more of the at least one planar layer for the first room image and duplicating one of more of the at least one wall layer for the first room image, and modifying the at least one duplicate planar layer and the at least one duplicate wall layer; and applying the first room image and the second room image as patterns to a surface of a building image.

In one implementation, generating at least one planar layer in depth for a first room image includes conveying a room interior effect for a room visible through a window in the surface of the building image. In one implementation, the method further includes defining each planar layer by specifying color and transparency of each planar layer. In one implementation, the color of each planar layer is specified using at least one area of uniform color. In one implementation, the method further includes verifying each planar layer, wherein each planar layer is tested to be substantially parallel to at least one other planar layer. In one implementation, the method further includes generating a ceiling layer for a ceiling in the room image and a floor layer for a floor in the room image. In one implementation, the method further includes verifying a wall layer is substantially perpendicular to one or more of the at least one planar layer. In one implementation, the method further includes generating at least one planar layer in depth for a third room image; generating at least one planar layer in depth for a fourth room image, wherein the third room image and the fourth room image represent a single connected room visible through two respective windows; calculating a parallax offset between a planar layer for the third room image and a planar layer for the fourth room image; and calculating a shading reflection using the parallax offset for at least one surface in the third room image. In one implementation, the method further includes creating multiple room images by duplicating at least one planar layer and at least one wall layer from the first room image; and modifying the at least one duplicate planar layer and the at least one duplicate wall layer for each of the multiple room images.

In another implementation, a room shader for generating image data for a room image is disclosed. The room shader includes: a layers generator to generate at least one planar layer in depth for a first room image; a wall generator to generate at least one wall layer for a wall in the first room image; a pattern multiplier to create a second room image by duplicating one or more of the at least one planar layer for the first room image and duplicating one or more of the at least one wall layer for the first room image, the pattern multiplier to modify the at least one duplicate planar layer and the at least one duplicate wall layer; and a pattern applier to apply the first room image and the second room image as patterns to a surface of a building image.

In one implementation, the layers generator conveys a room interior effect for a room visible through a window in the surface of the building image. In one implementation, the room shader further includes a define layer unit to define each planar layer by specifying color and transparency of each planar layer. In one implementation, the color of each planar layer is specified using at least one area of uniform color. In one implementation, the room shader further includes a verify layer unit to verify each planar layer, wherein each planar layer is tested to be substantially parallel to at least one other planar layer. In one implementation, the verify layer unit also verifies a wall layer is substantially perpendicular to one or more of the at least one planar layer. In one implementation, the room shader further includes a ceiling generator to generate a ceiling layer for a ceiling in the room image; and a floor generator to generate a floor layer for a floor in the room image. In one implementation, the room shader further includes a parallax offset calculator; and a reflection shader, wherein the layers generator also generates at least one planar layer in depth for a third room image, and generates at least one planar layer in depth for a fourth room image, wherein the third room image and the fourth room image represent a single connected room visible through two respective windows, the parallax offset calculator to calculate a parallax offset between a planar layer for the third room image and a planar layer for the fourth room image, and a reflection shader to calculate a shading reflection using the parallax offset for at least one surface in the third room image. In one implementation, the room shader further includes a pattern multiplier to create multiple room images by duplicating at least one planar layer and at least one wall layer from the first room image; and a pattern applier to modify the at least one duplicate planar layer and the at least one duplicate wall layer for each of the multiple room images.

In another implementation, a non-transitory computer-readable storage medium storing a computer program to generate image data for a room image is disclosed. The computer program includes executable instructions that cause a computer to: generate at least one planar layer in depth for a first room image; generate at least one wall layer for a wall in the first room image; create a second room image by duplicating the at least one planar layer for the first room image and duplicating one or more of the at least one wall layer for the first room image, and modifying one or more of the at least one duplicate planar layer and the at least one duplicate wall layer; and apply the first room image and the second room image as patterns to a surface of a building image.

In one implementation, the executable instructions that cause the computer to generate at least one planar layer in depth for a first room image includes executable instructions that cause the computer to convey a room interior effect for a room visible through a window in the surface of the building image.

Other features and advantages should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended drawings, in which like reference numerals refer to like parts, and in which.

DETAILED DESCRIPTION

Figure 1:
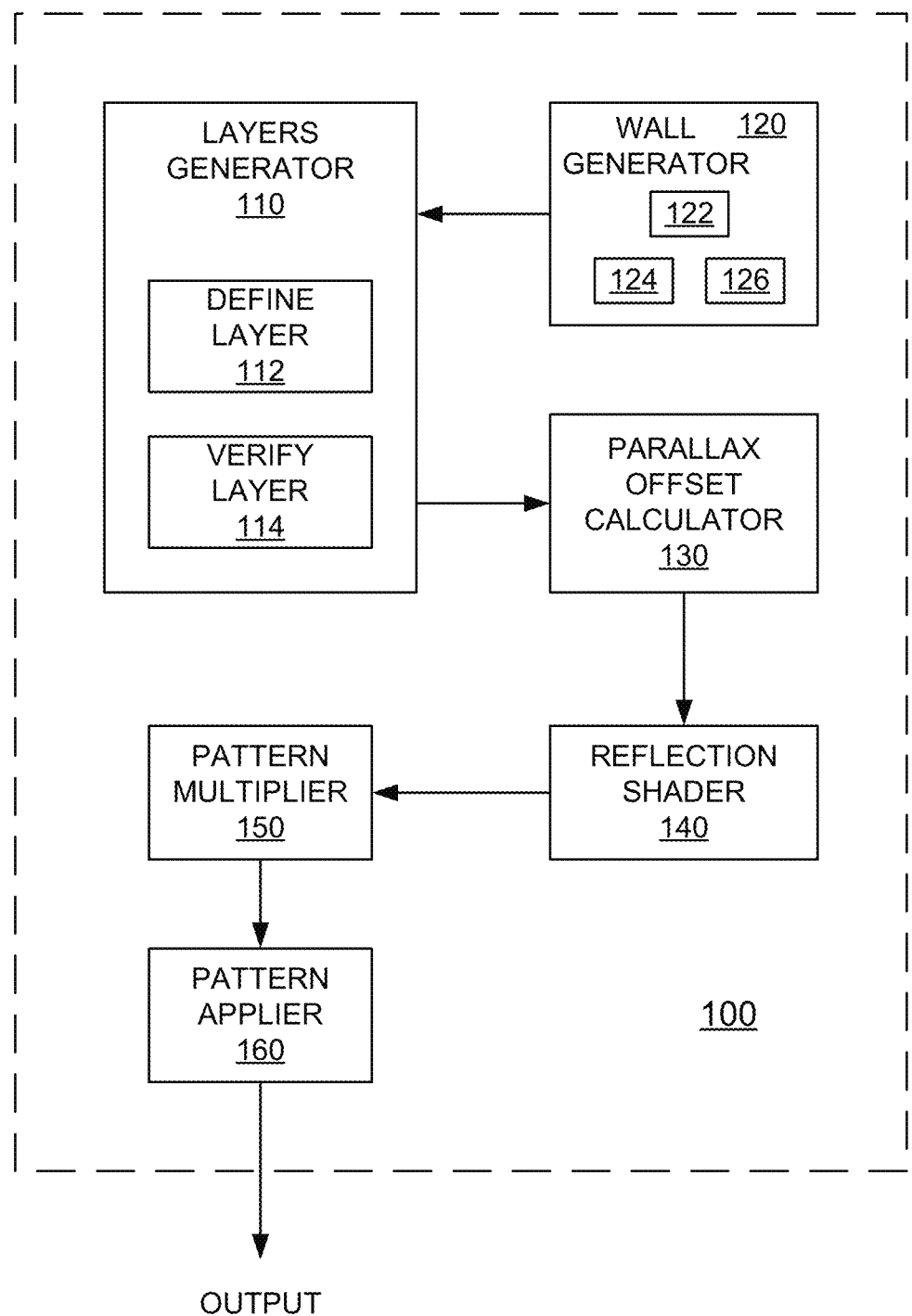
FIG. 1 is a block diagram of a room shader for an animated movie in accordance with one implementation of the present disclosure.

As described above, in the past, shaders for animated movies were written to emulate the look of room interiors in buildings to create the illusion of a room in place of real geometry that would be too cumbersome to render. Thus, the object was to match the look of a real building interior or surface reflection that is seen in real life. However, in some cases, creating an abstract look to match comic book and film specific artwork may be desirable.

Certain implementations of the present disclosure provide for a room shader for an animated movie that creates an illusion of depth on a flat surface, which is applied to all of the room interior geometry within buildings with windows. In one implementation, the room shader conveys a graphically-illustrated room interior effect with multiple layers in depth. In another implementation, an alternate shader is provided to illustrate graphic reflections. After reading these descriptions, it will become apparent how to implement the disclosure in various implementations and applications.

Although various implementations of the present disclosure will be described herein, it is understood that these implementations are presented by way of example only, and not limitation. As such, this detailed description of various implementations should not be construed to limit the scope or breadth of the present disclosure.

In one implementation, the room shader provides for conveying a graphically-illustrated room interior effect with multiple planar layers in depth for each room image. In one implementation, the room shader also inserts ceilings, floors and walls as layers for each room image. Multiple versions of the room images are created to depict patterns of business, residential and retail interiors. The frequency and size of the patterns can be adjusted, and window shades and curtains can be added.

In one implementation, the room shader depicts the room interiors as a series of planar layers behind the glass of the window to provide classic animation styles. In one implementation, each of the layers is depicted in a plane that is substantially parallel to the window. In another implementation, the ceilings, floors and walls (collectively referred to as "walls") are depicted in planes that are substantially perpendicular to the window. In this implementation, the term "substantially perpendicular" refers to each layer being less than 1 degree from the 90 degrees between the layers and the window.

In a further implementation, each of the layers is depicted as a solid brushstroke of uniform color. As buildings recede into the distance, the brushstrokes are simplified into larger shapes until only a single color per room remains. In a further implementation, to depict patterns representing connected rooms that often span several adjacent windows, the room shader starts with a streamlined version of the standard room interior shader and does away with side walls. However, in some implementations, UV offsets are used for calculating parallax offsets because multiple layers are needed.

In another implementation, in addition to using the above-described method for room interiors, an alternate shader is used to illustrate graphic reflections. For reflections, specific graphic shapes are painted, which are then "layered" and "dialed" in depth on the surface of the reflective materials. The shader is then used to reflect these shapes and the environment (e.g., on glass and metal).

FIG. 1 is a block diagram of a room shader 100 for an animated movie in accordance with one implementation of the present disclosure. In one implementation, the room shader 100 includes a layers generator 110, a wall generator 120, a parallax offset calculator 130, a reflection shader 140, a pattern multiplier 150, and a pattern applier 160. The layers generator 110 may include at least define layer unit 112 and verify layer unit 114.

In the illustrated implementation of FIG. 1, the room shader 100 for the animated movie is configured to create an illusion of depth of the room interior on flat surfaces such as sides of the buildings with windows. In one implementation, the layers generator 110 conveys a graphically-illustrated room interior effect with at least one layer in depth. In one implementation, the define layer unit 112 defines each layer as a plane. In another implementation, the define layer unit 112 defines each layer of the at least one layer by specifying the color and the transparency of each layer. Thus, in one implementation, each layer is painted with solid brushstrokes of uniform color. As buildings recede into the distance, the brushstrokes are simplified into larger shapes until only a single color per room remains.

In one implementation, the verify layer unit 114 verifies the viability of each layer when combined into the at least one layer. In one implementation, the verify layer unit 114 also verifies that each layer is substantially parallel to the window (i.e., the front-most layer) of the room. In this implementation, the term "substantially parallel" refers to each layer being less than 1 degree from the zero degrees between the layers and the window.

In one implementation, the wall generator 120 inserts ceilings, floors and walls as layers for each room image. Thus, the wall generator 120 includes a wall generator 122 to generate wall layers for walls in the room image, a ceiling generator 124 to generate a ceiling layer for a ceiling in the room image, and a floor generator 126 to generate a floor layer for a floor in the room image. In one implementation, the ceilings, floors and walls generated by the wall generator 120 are verified by the verify layer unit 114 to be substantially perpendicular to the window of the room.

Once all the layers (and walls) have been defined and verified, the pattern multiplier 150 and the pattern applier 160 work collectively to create multiple versions of the room images defined and verified as layers and walls. Thus, the created multiple versions of the room images are used to depict patterns of business, residential and retail interiors. In one implementation, the pattern multiplier 150 adjusts the frequency and size of the patterns and the pattern applier 160 applies the patterns to the flat surfaces of the buildings to create the illusion of depth.

In a further implementation, to depict patterns representing connected rooms that often span several adjacent windows, the room shader starts with a streamlined version of the standard room interior shader. However, in some implementations, the parallax offset calculator 130 uses the UV offsets to calculate parallax offsets.

In another implementation, the room shader 100 includes a reflection shader 140 which is used to illustrate graphic reflections. For reflections, specific graphic shapes are painted, which are then "layered" and "dialed" in depth on the surface of the reflective materials. The reflection shader 140 is then used to reflect these shapes and the environment (e.g., on glass and metal).

Figure 2:
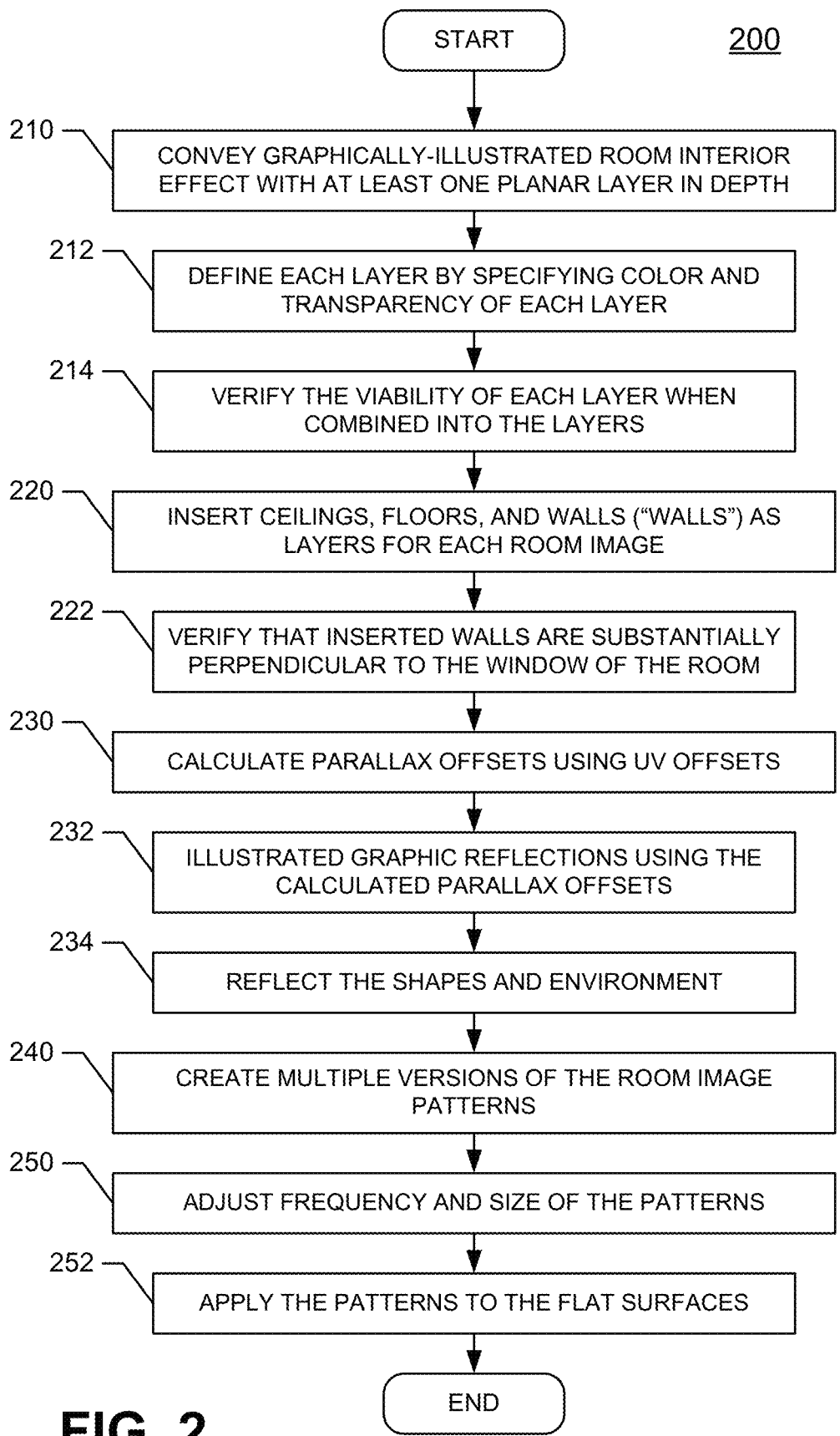
FIG. 2 is a flow diagram of a room shading process for an animated movie which creates an illusion of depth on a flat surface in accordance with one implementation of the present disclosure.

FIG. 2 is a flow diagram of a room shading process 200 for an animated movie which creates an illusion of depth on a flat surface in accordance with one implementation of the present disclosure. In one implementation, the room shading process 200 includes the steps of generation of planar layers, generation of walls, calculation of parallax offset, shading reflection, multiplying patterns, and applying the patterns. Further, the planar layers generation step may include at least layer defining and layer verifying steps.

In one implementation, a graphically-illustrated room interior effect is conveyed, at step 210, with at least one planar layer in depth. In one implementation, the step 210 includes step 212 to define each layer of the at least one planar layer by specifying the color and the transparency of each layer. Thus, in one implementation, each layer is painted with solid brushstrokes of uniform color. As buildings recede into the distance, the brushstrokes are simplified into larger shapes until only a single color per room remains. The step 210 further includes step 214 to verify the viability of each layer when combined into the at least one layer. In one implementation, each layer is verified that it is substantially parallel to the window (i.e., the front-most layer) of the room.

In one implementation, the room shading process 200 also inserts, at step 220, ceilings, floors and walls as layers for each room image. The inserted ceilings, floors and walls are then verified, at step 222, to be substantially perpendicular to the window of the room.

In a further implementation, to depict patterns representing connected rooms that often span several adjacent windows, the room shading process 200 starts with a streamlined version of the standard room interior shader. However, in some implementations, the UV offsets are used to calculate parallax offsets, at step 230.

In another implementation, the room shading process 200 illustrates graphic reflections, at step 232 using the calculated parallax offset. For reflections, specific graphic shapes are painted, which are then "layered" and "dialed" (or adjusted) in depth on the surface of the reflective materials. The shapes and the environment (e.g., on glass and metal) are reflected, at step 234.

Once all the layers (and walls) have been defined and verified, the room shading process 200 creates, at step 240, multiple versions of the room image patterns are defined and verified as layers and walls. Thus, the created multiple versions of the room image patterns are used to depict patterns of business, residential and retail interiors. In one implementation, the frequency and size of the patterns are adjusted, at step 250, and the patterns are applied, at step 252, to the flat surfaces of the buildings to create the illusion of depth.

Figure 3A:
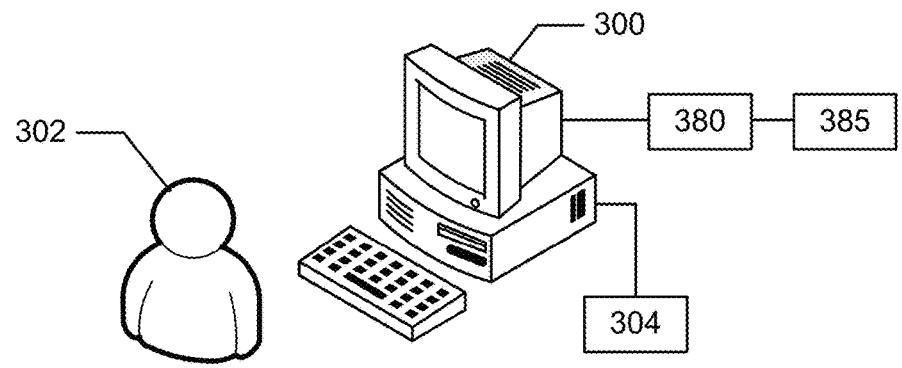
FIG. 3A is a representation of a computer system and a user in accordance with an implementation of the present disclosure.

FIG. 3A is a representation of a computer system 300 and a user 302 in accordance with an implementation of the present disclosure. The user 302 uses the computer system 300 to implement a room shading application 390 as illustrated and described with respect to the room shader 100 and the room shading process 200 in FIGS. 1 and 2.

Figure 3B:
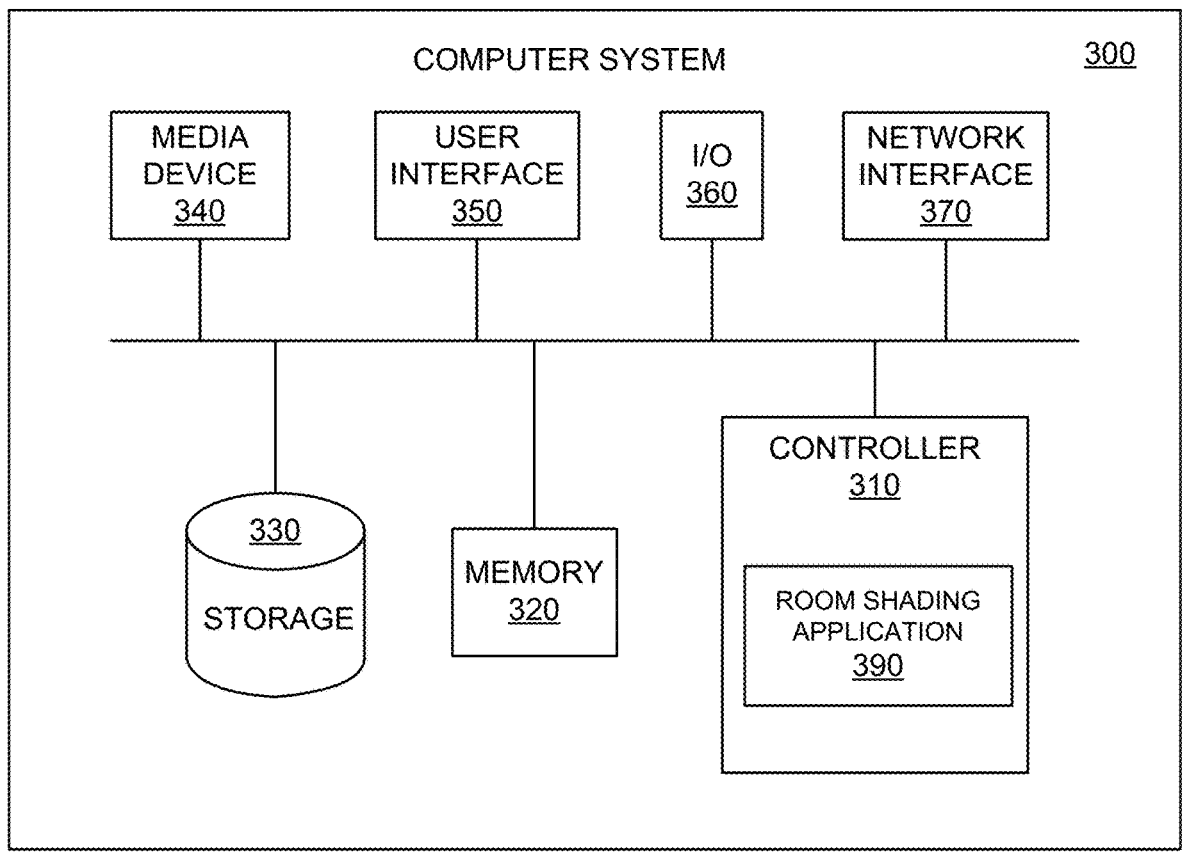
FIG. 3B is a functional block diagram illustrating the computer system hosting the room shading application in accordance with an implementation of the present disclosure.

The computer system 300 stores and executes the room shading application 390 of FIG. 3B. In addition, the computer system 300 may be in communication with a software program 304. Software program 304 may include the software code for the room shading application 390. Software program 304 may be loaded on an external medium such as a CD, DVD, or a storage drive, as will be explained further below.

Furthermore, computer system 300 may be connected to a network 380. The network 380 can be connected in various different architectures, for example, client-server architecture, a Peer-to-Peer network architecture, or other type of architectures. For example, network 380 can be in communication with a server 385 that coordinates engines and data used within the room shading application 390. Also, the network can be different types of networks. For example, the network 380 can be the Internet, a Local Area Network or any variations of Local Area Network, a Wide Area Network, a Metropolitan Area Network, an Intranet or Extranet, or a wireless network.

FIG. 3B is a functional block diagram illustrating the computer system 300 hosting the room shading application 390 in accordance with an implementation of the present disclosure. A controller 310 is a programmable processor and controls the operation of the computer system 300 and its components. The controller 310 loads instructions (e.g., in the form of a computer program) from the memory 320 or an embedded controller memory (not shown) and executes these instructions to control the system. In its execution, the controller 310 provides the room shading application 390 with a software system, such as to enable the creation and configuration of engines and data extractors within the room shading application 390. Alternatively, this service can be implemented as separate hardware components in the controller 310 or the computer system 300.

Memory 320 stores data temporarily for use by the other components of the computer system 300. In one implementation, memory 320 is implemented as RAM. In one implementation, memory 320 also includes long-term or permanent memory, such as flash memory and/or ROM.

Storage 330 stores data either temporarily or for long periods of time for use by the other components of the computer system 300. For example, storage 330 stores data used by the room shading application 390. In one implementation, storage 330 is a hard disk drive.

The media device 340 receives removable media and reads and/or writes data to the inserted media. In one implementation, for example, the media device 340 is an optical disc drive.

The user interface 350 includes components for accepting user input from the user of the computer system 300 and presenting information to the user 302. In one implementation, the user interface 350 includes a keyboard, a mouse, audio speakers, and a display. The controller 310 uses input from the user 302 to adjust the operation of the computer system 300.

The I/O interface 360 includes one or more I/O ports to connect to corresponding I/O devices, such as external storage or supplemental devices (e.g., a printer or a PDA). In one implementation, the ports of the I/O interface 360 include ports such as: USB ports, PCMCIA ports, serial ports, and/or parallel ports. In another implementation, the I/O interface 360 includes a wireless interface for communication with external devices wirelessly.

The network interface 370 includes a wired and/or wireless network connection, such as an RJ-45 or "Wi-Fi" interface (including, but not limited to 802.11) supporting an Ethernet connection.

The computer system 300 includes additional hardware and software typical of computer systems (e.g., power, cooling, operating system), though these components are not specifically shown in FIG. 3B for simplicity. In other implementations, different configurations of the computer system can be used (e.g., different bus or storage configurations or a multi-processor configuration).

Figure 4:
FIG. 4 shows an example image of buildings with flat surfaces that are inserted with room interiors made with the room shader (of FIG. 1) using the room shading process (of FIG. 2) in accordance with one implementation of the present disclosure.

FIG. 4 shows an example image of buildings with flat surfaces that are inserted with room interiors made with the room shader 100 using the room shading process 200 in accordance with one implementation of the present disclosure.

The description herein of the disclosed implementations is provided to enable any person skilled in the art to make or use the present disclosure. Numerous modifications to these implementations would be readily apparent to those skilled in the art, and the principals defined herein can be applied to other implementations without departing from the spirit or scope of the present disclosure. Thus, the present disclosure is not intended to be limited to the implementations shown herein but is to be accorded the widest scope consistent with the principal and novel features disclosed herein.

Various implementations of the present disclosure are realized in electronic hardware, computer software, or combinations of these technologies. Some implementations include one or more computer programs executed by one or more computing devices. In general, the computing device includes one or more processors, one or more data-storage components (e.g., volatile or non-volatile memory modules and persistent optical and magnetic storage devices, such as hard and floppy disk drives, CD-ROM drives, and magnetic tape drives), one or more input devices (e.g., game controllers, mice and keyboards), and one or more output devices (e.g., display devices).

The computer programs include executable code that is usually stored in a persistent storage medium and then copied into memory at run-time. At least one processor executes the code by retrieving program instructions from memory in a prescribed order. When executing the program code, the computer receives data from the input and/or storage devices, performs operations on the data, and then delivers the resulting data to the output and/or storage devices.

In a further implementation, quantization of surface normals is disclosed. Artists often reduce complex forms to simple planes to convey the forms in a more graphic way. However, the reduction of the forms was needed to be done in 3-D. Although the patterns could be painted into the model, since the underlying shading is still smooth, the patterns appear like any texture. Although building the planes into the model may work, the shapes might not work when deformed or viewed at different distances. Thus, what is needed s a solution that shades as if it was a model, but is flexible enough to modify at render time. A solution to the above-described problem is to create a shader which tricks the surface into rendering as if it were constructed of planes.

Tools are written to simplify geometry at render time by cheating normals to be planar. That is, the normal is quantized on each axis. In one implementation, a tool includes four methods: step (or modulus), 3-D rounding (snapping to grid points), "latlong" mapping of normals, and cellnoise. To add complexity (especially for simple step and rounding which tend to feature patterns of horizontal and vertical edges), inputs are added which allows other upstream functions to influence the resulting quantization. For the step method, this generally means either tilting the normal prior to quantization, or biasing the frequency along each axis. For the rounding and cellnoise methods, the common approach for adding irregularity was to manipulate the length of the vector. Extending the vector refines precision, because as the length of N increases, the angle between N and the new vector (created by snapping the endpoint of N to the nearest grid point) would decrease. Further, the abilty to multiply is added by a varying vector to change the frequency per axis, to expand the search area (also to increase precision), and the ability to allow only a percentage of cell points to influence the normal (decreasing precision). Moreover, cellnoise also provides options for jitter, secondary positions and an array of distance metric. The latlong mapping provides a way pass in more specific mappings, and also (because it supported filtering) supplied a means of rounding the edges of virtual planes.

Those of skill in the art will appreciate that the various illustrative modules and method steps described herein can be implemented as electronic hardware, software, firmware or combinations of the foregoing. To clearly illustrate this interchangeability of hardware and software, various illustrative modules and method steps have been described herein generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the present disclosure. In addition, the grouping of functions within a module or step is for ease of description. Specific functions can be moved from one module or step to another without departing from the present disclosure.

All features of each above-discussed example are not necessarily required in a particular implementation of the present disclosure. Further, it is to be understood that the description and drawings presented herein are representative of the subject matter which is broadly contemplated by the present disclosure. It is further understood that the scope of the present disclosure fully encompasses other implementations that may become obvious to those skilled in the art and that the scope of the present disclosure is accordingly limited by nothing other than the appended claims.

The invention claimed is:

1. A method of generating image data for a room image for an animated movie, the method comprising:
generating a first plurality of planar layers in depth for a first room image including conveying a room interior effect for a room visible through a window on a flat surface of a building image by specifying color and transparency of each planar layer of the first plurality of planar layers to create an illusion of depth on the flat surface,
wherein each layer of the first plurality of planar layers in depth is depicted in a plane that is substantially parallel to the window and while ceilings, floors, and walls are depicted in a plane that is substantially perpendicular to the window,
wherein the first plurality of planar layers is depicted behind a glass of the window to provide classic animation styles for the animated movie;
generating a first plurality of wall layers for a wall in the first room image;
creating a second room image by duplicating one or more of the first plurality of planar layers for the first room image to produce a second plurality of planar layers and duplicating one of more of the first plurality of wall layers for the first room image to produce a second plurality of wall layers, and modifying the second plurality of planar layers and the second plurality of wall layers by adjusting frequency and size of the one or more of the first plurality of planar layers and the one or more of the first plurality of wall layers;
applying the first room image and the second room image as patterns to the flat surface of the building image to create the illusion of depth;
generating a third plurality of planar layers in depth for a third room image;
generating a fourth plurality of planar layers in depth for a fourth room image, wherein the third room image and the fourth room image represent a single connected room visible through two respective windows;
calculating a parallax offset between a planar layer for the third room image and a planar layer for the fourth room image; and
calculating shading reflection using the parallax offset for at least one surface in the third room image.

2. The method of claim 1, wherein the color of each planar layer of the first plurality of planar layers is specified using at least one area of uniform color.

3. The method of claim 1, further comprising
verifying each planar layer of the first plurality of planar layers, wherein each planar layer is tested to be substantially parallel to at least one other planar layer of the first plurality of planar layers.

4. The method of claim 1, further comprising
generating a ceiling layer for a ceiling in the room image and a floor layer for a floor in the room image.

5. The method of claim 1, further comprising
verifying a wall layer of the first plurality of wall layers is substantially perpendicular to one or more of the first plurality of planar layers.

6. The method of claim 1, further comprising:
creating multiple room images by duplicating the first plurality of planar layers and first plurality of wall layers from the first room image; and
modifying the second plurality of planar layers and the second plurality of wall layers for each of the multiple room images.

7. A room shader for generating image data for a room image for an animated movie, the room shader comprising:
a layers generator to generate a first plurality of planar layers in depth for a first room image including conveying a room interior effect for a room visible through a window on a flat surface of a building image by specifying color and transparency of each planar layer of the first plurality of planar layers to create an illusion of depth on the flat surface,
wherein each layer of the first plurality of planar layers in depth is depicted in a plane that is substantially parallel to the window and while ceilings, floors, and walls are depicted in a plane that is substantially perpendicular to the window,
wherein the first plurality of planar layers is depicted behind a glass of the window to provide classic animation styles for the animated movie;
a wall generator to generate a first plurality of wall layers for a wall in the first room image;
a pattern multiplier to create a second room image by duplicating one or more of the first plurality of planar layers for the first room image to produce a second plurality of planar layers and duplicating one or more of the first plurality of wall layers for the first room image to produce a second plurality of wall layers,
the pattern multiplier to modify the second planar layers and the second wall layers by adjusting frequency and size of the one or more of the first plurality of planar layers and the one or more of the first plurality of wall layers;
a pattern applier to apply the first room image and the second room image as patterns to the flat surface of the building image to create the illusion of depth;
a parallax offset calculator; and
a reflection shader,
wherein the layers generator also generates a third plurality of planar layers in depth for a third room image, and generates a fourth plurality of planar layers in depth for a fourth room image,
wherein the third room image and the fourth room image represent a single connected room visible through two respective windows,
the parallax offset calculator to calculate a parallax offset between a planar layer for the third room image and a planar layer for the fourth room image, and
a reflection shader to calculate shading reflection using the parallax offset for at least one surface in the third room image.

8. The room shader of claim 7, wherein the color of each planar layer of the first plurality of planar layers is specified using at least one area of uniform color.

9. The room shader of claim 7, further comprising
a verify layer unit to verify each planar layer of the first plurality of planar layers, wherein each planar layer of the first plurality of planar layers is tested to be substantially parallel to at least one other planar layer of the first plurality of planar layers.

10. The room shader of claim 9, wherein the verify layer unit also verifies a wall layer is substantially perpendicular to one or more of the first plurality of planar layers.

11. The room shader of claim 7, further comprising:
a ceiling generator to generate a ceiling layer for a ceiling in the room image; and
a floor generator to generate a floor layer for a floor in the room image.

12. The room shader of claim 7, wherein:
the pattern multiplier creates multiple room images by duplicating the plurality of planar layers and plurality of wall layers from the first room image; and
the pattern applier modifies the second plurality of planar layers and the second plurality of wall layers for each of the multiple room images.

13. A non-transitory computer-readable storage medium storing a computer program to generate image data for a room image for an animated movie, the computer program comprising executable instructions that cause a computer to:
generate a first plurality of planar layers in depth for a first room image including conveying a room interior effect for a room visible through a window on a flat surface of a building image by specifying color and transparency of each planar layer of the first plurality of planar layers to create an illusion of depth on the flat surface,
wherein each layer of the first plurality of planar layers in depth is depicted in a plane that is substantially parallel to the window and while ceilings, floors, and walls are depicted in a plane that is substantially perpendicular to the window,
wherein the first plurality of planar layers is depicted behind a glass of the window to provide classic animation styles for the animated movie;
generate a first plurality of wall layers for a wall in the first room image;
create a second room image by duplicating one or more of the first plurality of planar layers for the first room image to produce a second plurality of planar layers and duplicating one of more of the first plurality of wall layers for the first room image to produce a second plurality of wall layers, and modifying the second plurality of planar layers and the second plurality of wall layers by adjusting frequency and size of the one or more of the first plurality of planar layers and the one or more of the first plurality of wall layers;
apply the first room image and the second room image as patterns to the flat surface of the building image to create the illusion of depth;
generate a third plurality of planar layers in depth for a third room image;
generate a fourth plurality of planar layers in depth for a fourth room image. wherein the third room image and the fourth room image represent a single connected room visible through two respective windows;
calculate a parallax offset between a planar layer for the third room image and a planar layer for the fourth room image; and
calculate shading reflection using the parallax offset for at least one surface in the third room image.

* * * * *